United States Patent
Wei

(10) Patent No.: US 8,912,049 B2
(45) Date of Patent: Dec. 16, 2014

(54) PEC BIASING TECHNIQUE FOR LEDS

(75) Inventor: Yajun Wei, Austin, TX (US)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 13/877,913

(22) PCT Filed: Oct. 10, 2011

(86) PCT No.: PCT/IB2011/054449
§ 371 (c)(1),
(2), (4) Date: Apr. 5, 2013

(87) PCT Pub. No.: WO2012/049607
PCT Pub. Date: Apr. 19, 2012

(65) Prior Publication Data
US 2013/0187194 A1    Jul. 25, 2013

Related U.S. Application Data

(60) Provisional application No. 61/392,328, filed on Oct. 12, 2010.

(51) Int. Cl.
| *H01L 21/00* | (2006.01) |
| *H01L 33/00* | (2010.01) |
| *H01L 25/16* | (2006.01) |
| *H01L 33/62* | (2010.01) |
| *H01L 21/66* | (2006.01) |
| *H01L 33/22* | (2010.01) |

(52) U.S. Cl.
CPC ............ *H01L 33/005* (2013.01); *H01L 25/167* (2013.01); *H01L 33/62* (2013.01); *H01L 22/14* (2013.01); *H01L 33/22* (2013.01); *H01L 2224/16* (2013.01); *H01L 33/0095* (2013.01)
USPC .................. 438/116; 438/17; 438/33; 257/99; 257/E31.105

(58) Field of Classification Search
CPC ... H01L 27/32; H01L 33/0095; H01L 25/167; H01L 33/24
USPC .................. 257/99, E31.105; 438/17, 33, 116
See application file for complete search history.

(56) References Cited

U.S. PATENT DOCUMENTS

| 2006/0014310 A1 | 1/2006 | Epler et al. |
| 2006/0154391 A1 | 7/2006 | Tran et al. |
| 2010/0006864 A1 | 1/2010 | Steigerwald |

*Primary Examiner* — Elias M Ullah

(57) ABSTRACT

Each LED in an array of LEDs mounted on a submount wafer has at least a first semiconductor layer exposed and connected to a first electrode of each LED. The submount wafer has a first metal portion bonded to the first electrode of each LED for providing an energization current to each LED. The submount wafer also has a second metal portion running along and proximate to the first metal portion but not electrically connected to the first metal portion. The second metal portion may be interdigitated with the first metal portion. The second metal portion is connected to a bias voltage. When the wafer is immersed in an electrically conductive solution for electrochemical (EC) etching of the exposed first semiconductor layer, the solution electrically connects the second metal portion to the first metal portion for biasing the first semiconductor layer during the EC etching.

15 Claims, 4 Drawing Sheets

PEC BIASING TECHNIQUE FOR LEDS

FIELD OF THE INVENTION

This invention relates to forming light emitting diodes (LEDs) and, in particular, to a method for electrically biasing an exposed LED layer during electrochemical etching.

BACKGROUND

A typical flip-chip LED has reflective p and n contacts on a bottom surface of the LED, and the contacts are directly connected to bonding pads on a submount. Light generated by the LED is primarily emitted through the top surface of the LED surface. In this way, there are no top contacts that block the light, and wire bonds are not needed.

During fabrication, a submount wafer is populated with an array of LED dies, and the LED dies are further processed as a batch on the wafer. Ultimately, the wafer is singulated by, for example, sawing.

The efficiency of flip-chip gallium-nitride (GaN) LEDs can be increased by removing the transparent sapphire growth substrate after all the LED layers have been epitaxially grown. After the removal of the substrate, the exposed GaN layer is etched to thin the layer and to create a roughened surface to increase light extraction. A good etching technique for the exposed layer is photo-electrochemical (PEC) etching, which involves electrically biasing the layer to be etched, immersing the LED in a base solution (e.g., KOH) containing a biased electrode, and applying UV light to the exposed layer. Exposure to the UV light generates electron-hole pairs in the semiconductor layer. The holes migrate to the surface of the GaN layer under the influence of the electric field, then react with the GaN and base solution at the surface to break the GaN bonds. The exposed layer is typically an N-type confining layer or a semi-insulating layer (e.g., a buffer layer) over the N-type layer.

One possible method for biasing the exposed N-type LED layer is to provide a grounded metal pattern on the submount wafer that connects to all the N-metal bonding pads on the wafer so the exposed N-type layer is electrically biased during the PEC etching. After the PEC etching, when the submount wafer is sawed to dice the LEDs, the biasing metal pattern is cut so has no effect on the subsequent operation of each singulated LED.

Applicant has found that one problem with using the interconnecting metal on the submount for biasing is that, after sawing the submount wafer for dicing, the traces connecting to the N-metals are exposed on the sidewalls. This reduces the creepage distance between the active N electrodes and the grounding pads on the backside. This limits the maximum number of LEDs that can be connected in series before creepage can develop between the N-metal and ground.

Further, the sawed metal can be smeared along the sidewall of the submount die during the sawing and form a leakage path across the submount edge or side or to another lead. Another problem with the interconnecting metal is that an LED string cannot be tested unless the metal is cut prior to the singulation sawing. This adds a process step. Further, when forming multiple mini-LEDs in a single die, the N-layers cannot be interconnected with a sawable interconnection metal.

What is needed is an efficient technique to bias the exposed layer of LEDs mounted on a submount wafer during PEC etching that does not have the drawbacks of the metal interconnect described above.

SUMMARY

A wafer-scale process is described that simultaneously etches, using PEC etching, any number of LEDs mounted on a single submount wafer.

Although the invention is described using flip-chip LEDs in the examples, any type of LED may make use of the invention, such as LEDs having one or more top wire bond electrodes.

Initially, LEDs are formed over a sapphire substrate. The LEDs are singulated and mounted on a submount wafer. The submount wafer has metal pads for bonding to the N (cathode) and P (anode) electrodes of the flip-chip LEDs. The metal pads extend to terminals that are to be eventually connected to a power source.

The sapphire substrate is then removed from each LED die, such as by using a laser lift-off process. The exposed layers (assuming N-type) of all the LEDs are then etched, using a PEC etch process, for thinning and roughening to increase light extraction. Instead of a metal interconnect directly connected to all the submount wafer's N-metal for biasing all the N-type layers of the LEDs during PEC etching, a metal pattern is formed on the submount wafer proximate to the N-metal, such as spaced 50 microns from the N-metal. The metal pattern is electrically isolated from the N-metal so does not affect the operation of the LEDs. However, when the submount wafer is immersed in the KOH solution for PEC etching and the metal pattern is grounded (biased) during the PEC etch process, the relatively low resistivity of the KOH solution (e.g., 0.016 ohms·m) effectively shorts the metal pattern to the N-metal for biasing the N-type layers of all the LEDs to ground. Other biasing voltages can be used.

After the PEC etch process, the metal pattern has no effect on the LEDs' operation since it is electrically isolated from the N-metal on the submount wafer. Therefore, the submount does not suffer from any of the drawbacks incurred by sawing through a prior art metal interconnect that is connected to the submount's N-metal. Since the inventive metal pattern is electrically isolated from the LEDs, strings of series-connected LEDs on the wafer can be tested.

In another embodiment, the P-layer is the light emitting layer and is etched using PEC etching while being biased using the inventive technique.

In another embodiment, the etching can be electrochemical (EC) without the use of UV, rather than PEC etching. PEC etching is a subset of electrochemical etching.

Aspects of the process may be applied to LEDs that are not GaN based, such as AlGaAs and AlInGaP LEDs.

BRIEF DESCRIPTION OF THE DRAWINGS

Elements that are the same or equivalent are labeled with the same numeral.

DETAILED DESCRIPTION

Figure 1:
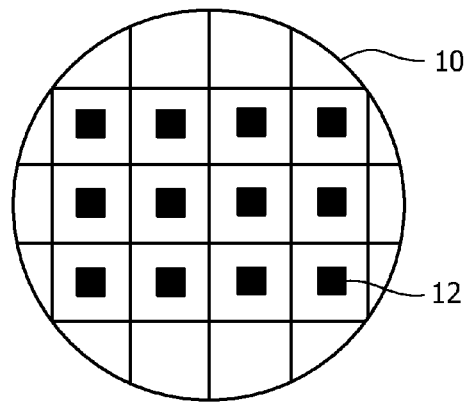
FIG. 1 illustrates a submount wafer populated with an array of LED dies.

FIG. 1 illustrates a submount wafer 10 populated with an array of LED dies 12. There may be hundreds of dies 12 bonded to the wafer 10. The submount base material may be ceramic, silicon, insulated aluminum, or other material.

Figure 2:
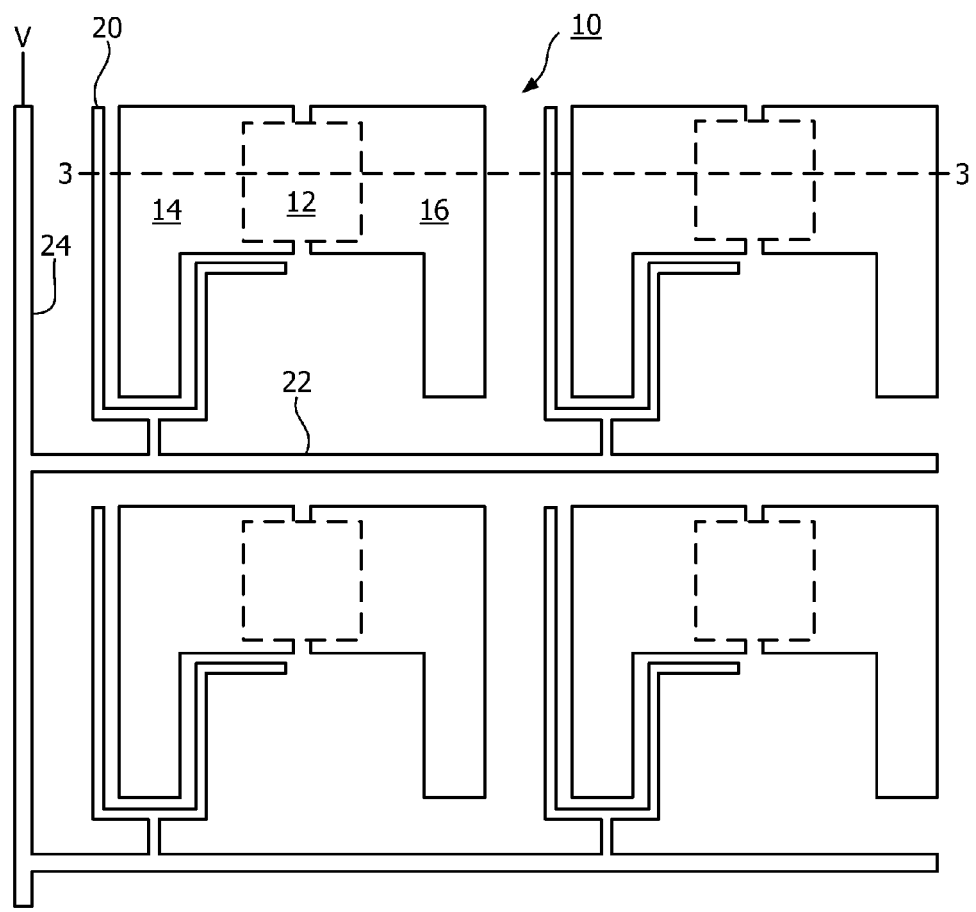
FIG. 2 is a magnified top down view of four LED areas on the submount wafer of FIG. 1, showing the biasing metal pattern in accordance with one embodiment of the invention.

FIG. 2 is a close up of four adjacent LED areas on the wafer 10, showing the N-metal 14 and P-metal 16 on the wafer 10 surface. The metal 14/16 forms pads for bonding to the electrodes of the LED dies 12. The LEDs 12 and metal 14/16 can be any size. The metal 14/16 may be copper plated with Ni/Au for bonding to the cathode and anode Ni/Au electrodes on the bottom surface of the LED dies 12. The LED electrodes may be bonded to the metal 14/16 by ultrasonic welding or other methods.

The metal 14/16 may be connected to bottom pads of each submount in the wafer 10 by vias extending through the wafer 10. After singulation, the bottom pads may then be surface mounted on a printed circuit board.

A metal pattern 20 is formed to be very close to the N-metal 14, such as 50 microns, so as to be electrically insulated. The gap is selected so that, during a PEC etch, the KOH solution (or other electrolyte solution) acts as a conductor to short out the metal pattern 20 to the N-metal 14 to bias the N-layers of the LED dies 12 during the PEC etching. In one embodiment, the resistivity of the KOH solution (e.g., using 4 moles/liter concentration) is about 0.016 ohms·m. In a typically example, this will result in less than 1.4 ohms across the 50 micron gap, assuming a width of the gap is about 11.56 mm and the metallization thickness is 50 microns [(0.016 ohms·m×50 micron gap)/(11.56 mm×50 microns thick)=1.384 ohms] The gap can range from 10 microns or less to a few hundred microns (e.g., 300) in order to electrically isolate the metal pattern 20 from the N-metal 14 in a dry environment while providing an adequate bias during the PEC etching. The width of the opposing edges along the gap and trace thickness directly determine the conduction between the two metals. There is very little current flow during PEC etching, so any resistivity through the KOH solution does not significantly affect the PEC process.

The metal pattern 20 includes bus bars 22 and 24, which connect to a biasing voltage V, such as ground or other voltage. The metal pattern 20 can be any width or thickness.

After the PEC etch, the metal pattern 20 becomes isolated, and sawing of the bus bars 22 and 24 during singulation does not affect the performance of the LED dies 12.

In another embodiment, the biasing is performed for an electrochemical (EC) etch that does not use UV to accelerate the etch process.

Figure 3:
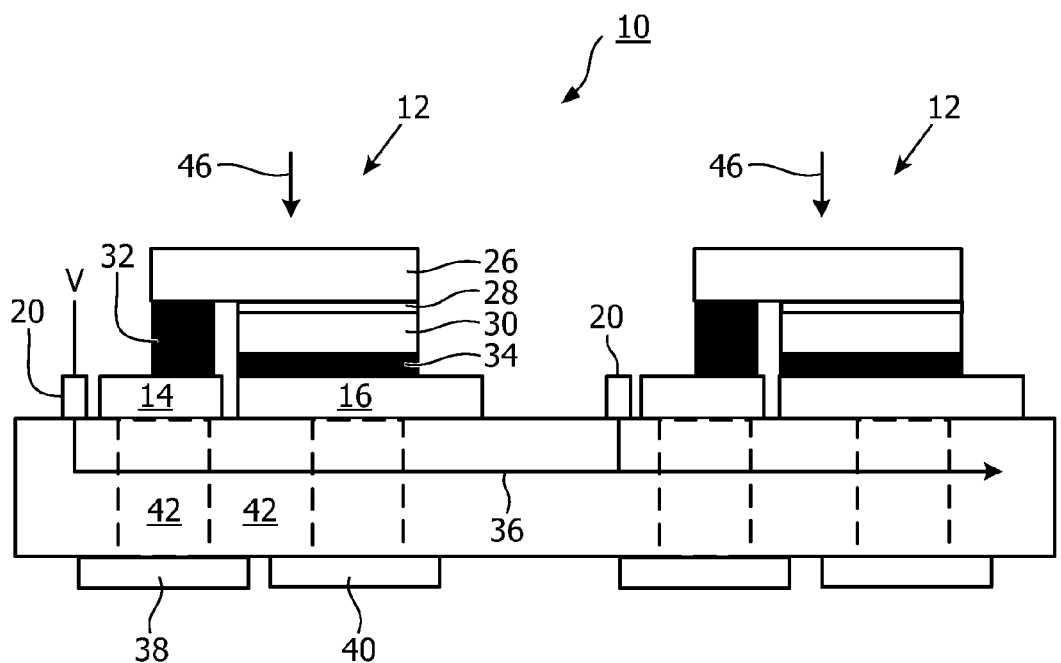
FIG. 3 is a simplified and compressed cross-sectional view, along line 3-3 of FIG. 2, of two LED areas on the submount wafer, showing the biasing metal pattern in accordance with one embodiment of the invention.

FIG. 3 is a simplified and compressed cross-sectional view of the LED dies 12 and submount wafer 10 along line 3-3 in FIG. 2. The LED dies 12 are simplified but generally comprise an epitaxially grown, semiconductor N-type layer 26, a semiconductor active layer 28, and semiconductor P-type layer 30. For a flip-chip, portions of the P-type layer 30 and active layer 28 are etched away to expose the N-type layer 26, and an N-electrode 32 is deposited to contact the N-type layer 26. A P-electrode 34 contacts the P-type layer 30. In one embodiment, the LEDs are AlInGaN and emit blue to amber light.

In one embodiment, the semiconductor layers are epitaxially grown over a sapphire substrate. After the LED dies 12 are singulated from the LED wafer and mounted on the submount wafer 10, with an optional underfill material deposited beneath the LED dies 12, the sapphire substrates are removed by, for example, laser lift off, which exposes the N-type layer 26. The N-type layer 26 may comprise various layers used for nucleation, stress relief, and cladding. The N-type layer 26 may then be thinned using any of various methods, including the PEC etch. The PEC etch may be used for all the thinning, or may be combined with other methods for thinning the N-type layer 26. It is preferable that the PEC etch be at least used for roughening the surface of the N-type layer 26 for improved light extraction.

The submount wafer 10 has formed on it the metal 14 and 16, as well as the metal pattern 20 for biasing during the PEC etch. The metal pattern 20 in FIG. 3 is schematically shown being electrically connected to other metal patterns 20 by the line 36, representing the bus 22 in FIG. 2.

The metal 14 and 16 are connected to the bottom cathode pad 38 and bottom anode pad 40 by vias 42 extending through the wafer 10.

In PEC etching, an electric field is created between the surface to be etched and the solution to increase the rate of etching and control the etch rate. To enable such biasing, the N-type layers 26 of the LED dies 12 are coupled to ground (or other suitable bias voltage) via the metal pattern 20, the KOH solution, and the N-metal pads 14.

Figure 4:
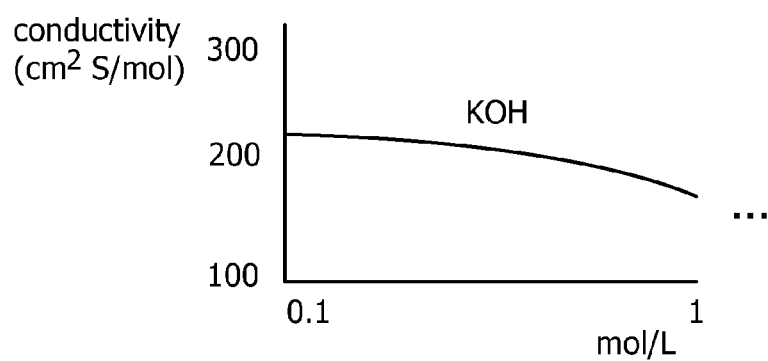
FIG. 4 is a prior art graph of the molar conductivity of a KOH solution vs. concentration.

FIG. 4 is a simplified graph from a 2003 publication, illustrating the conductivity of a KOH solution vs. its concentration. For gaps less than a few hundred microns, the resistance of the KOH solution is sufficiently low to provide an adequate low current bridge between the metal pattern 20 (FIG. 2) and the N-metal 14 for biasing the N-type layers 26 during PEC etching.

As shown in FIG. 3, the PEC etch 46 of the exposed surface of layer 26 is performed. The arrow 46 also represents the conductive solution. Layer 26 may be completely etched through during the PEC etch to create a porous layer.

To perform the PEC etching, at least the layer to be etched is immersed in an electrolytic solution and biased by the potential applied to the metal pattern 20. An electrode with a positive potential is immersed in the electrolytic solution to bias the base solution. An example of a suitable electrolytic solution is 0.2 M-4M KOH, though many other suitable electrolytic solutions, basic or acidic, may be used. The solution used and its concentration depend on the composition of the material to be etched and the desired surface texture. The epitaxial surface of the layer 26 is exposed to light with energy greater than the band gap of the surface layer. In one example, ultraviolet light with a wavelength of about 365 nm and an intensity between about 10 and about 100 mW/cm$^2$ is used. Exposure to the light generates electron-hole pairs in the semiconductor layer. The holes migrate to the surface of the GaN layer under the influence of the electric field. The holes then react with the GaN and the base solution at the surface to break the GaN bonds, according to the equation $2GaN + 6OH^- + 6e^+ = 2Ga(OH)_3 + N_2$. The current through the N-type layer 26 may be about 10 uA for each 1×1 mm$^2$ LED die 12. The PEC voltage should be kept below the diode breakdown voltage (e.g., below 5 volts). Additional detail of PEC etching of a GaN layer may be found in U.S. publications 2006/0014310 and 2010/0006864, by John Epler, assigned to the present assignee and incorporated herein by reference.

The resulting roughening of the surface of layer 26 reduces the internal reflections within the LED structure to increase extraction efficiency.

Further description about forming LED dies and submount wafers is found in U.S. Publication No. 2010/0006864, by John Epler, assigned to the present assignee and incorporated herein by reference.

Phosphor may be deposited over the LEDs, after the etching process, to wavelength-convert the light.

Figure 5:
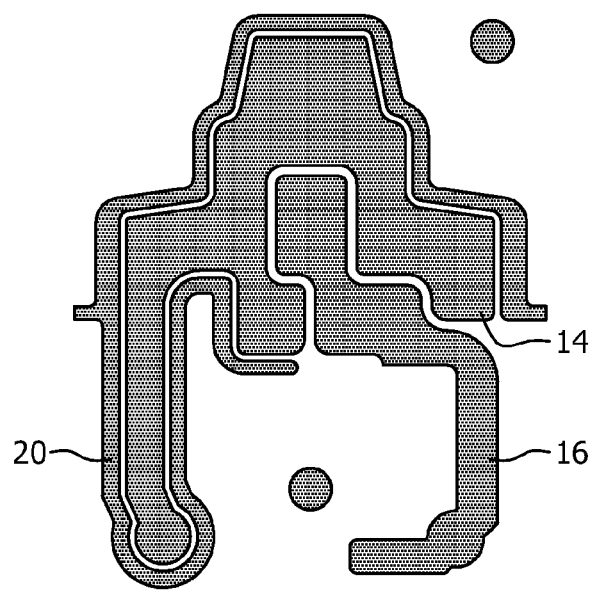
FIG. 5 is a representation of an actual bonding pad pattern on a submount, along with the PEC biasing metal, in accordance with one embodiment of the invention.

FIG. 5 illustrates an actual metal pad arrangement for a single LED die on a submount wafer, showing the N-metal 14, P-metal 16, and metal pattern 20 for biasing the exposed N-type layer of an LED die during PEC etching. In FIG. 5, the 50 micron gap is about 11.56 mm long.

After the wafer 10 has been removed from the KOH solution, rinsed, and dried, the LED dies 12 may be tested without concern about the effects of the metal pattern 20.

Figure 6A:
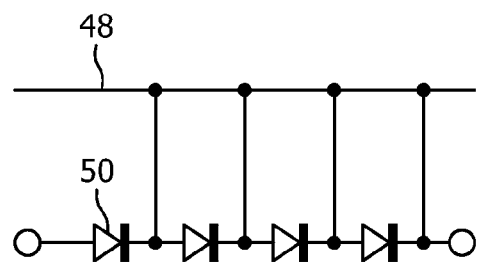
FIG. 6A illustrates a problem with testing a prior art string of LEDs that are interconnected with a biasing metal while on the submount wafer.

FIG. 6A illustrates a prior art example of a string of mini-LEDs (or LED cells) formed in a single die. A single die may be divided by trenches, and a metal layer connects the anodes and cathodes of the mini-LEDs in series. With the prior art technique of directly interconnecting the LED cathodes by a metal trace 48 on the submount wafer, for biasing the N-type layers during PEC etching, only the leftmost mini-LED 50 in the string can be tested since the other mini-LEDs are shorted out by the trace 48.

Figure 6B:
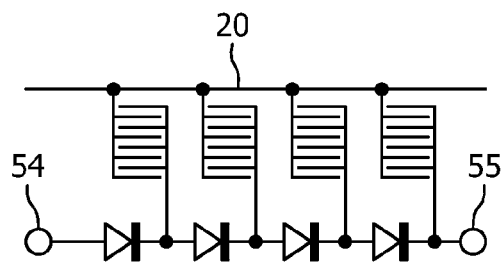
FIG. 6B illustrates that, when using the present invention, the string of LEDs can be tested on the submount wafer.

FIG. 6B illustrates an example of a string of mini-LEDs in accordance with the present invention, where their cathodes are electrically isolated from the biasing metal pattern 20 when not in the electrolytic solution. Note that the interdigitation of the metal pattern 20 and the N-metal 14 provides a long length for electrical contact through the KOH solution. Since the mini-LED cathodes are not shorted together, a test of the string of mini-LED dies may be performed by applying a current between the terminal ends 54/55 of the string.

Figure 7:
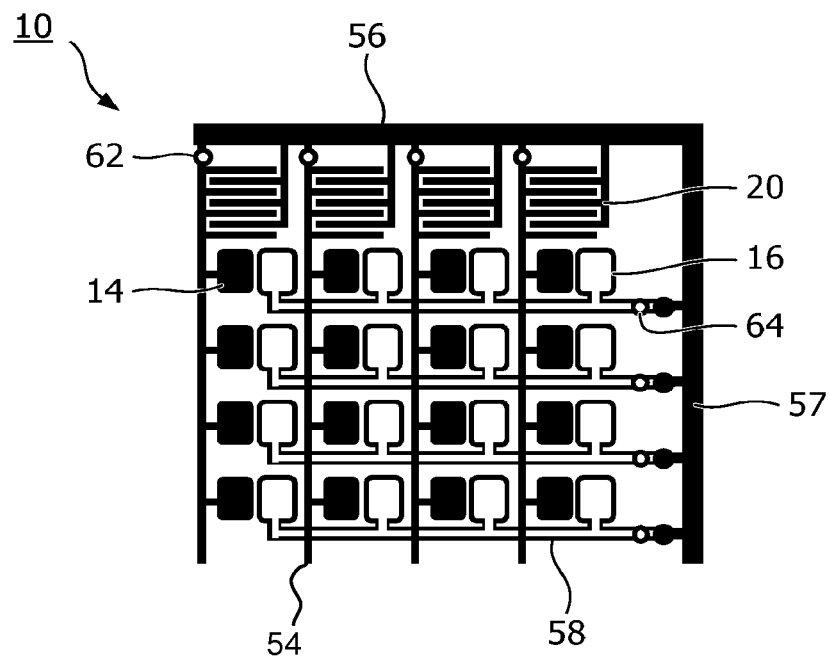
FIG. 7 is top down view of the metal pattern on a submount wafer, illustrating how the P and N contact pads can be biased for plating prior to LEDs being mounted on the wafer, followed by the LEDs being biased for PEC etching using the present invention.

Prior to the LED dies 12 being mounted on the wafer 10, the copper traces on the wafer 10 (forming at least the metal 14, 16, 20, 38, and 40 in FIG. 3) may be electroplated with Ni/Au using a biasing interconnection shown in FIG. 7.

FIG. 7 schematically illustrates a biasing technique for biasing the N-metal 14 and P-metal 16 on the submount wafer 10 for electroplating the metal 14 and 16 and for later biasing the N-metal 14 for the PEC etching. The metal configuration shown in FIG. 7 also allows each LED die to be separately tested by applying a current to a particular row and column line. All the N-metal 14 is connected together on the front surface of the submount wafer 10 by N-metal column busses 54 and a connecting bus line 56. All the P-metal 16 is connected together by interconnecting the anode pads 40 (FIG. 3) on the bottom surface of the submount wafer 10 by P-metal row busses 58 and a connecting bus line 57, which is ultimately shorted to the connecting bus line 56, such as with an interconnection external to the wafer 10. During electroplating of the metal 14 and 16 and the pads on the bottom surface of the submount wafer 10, the bus lines 56 and 57 are connected to a biasing voltage, and all the metal on the wafer 10 is plated with an Ni/Au layer.

Figure 8:
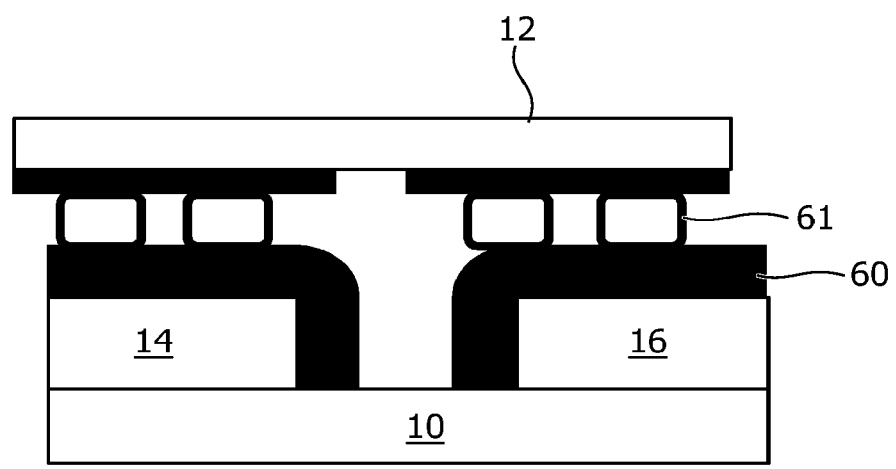
FIG. 8 is a cross-sectional view illustrating the electroplated pads on the submount.

FIG. 8 illustrates the copper seed layer for the N-metal 14 and P-metal 16 plated with an Ni/Au layer 60. The copper sidewalls are also plated since the seed layer has been patterned already. This widens the pads for bonding with the Ni/Au electrodes 61 of the LED die 12, improving the tolerance for placement of the LED dies on the submount 10.

In a non-desirable technique, all the submount 10 copper pads could be shorted together using a grid of interconnections during the plating process, where the grid would be later sawed through during singulation. However, if one wanted to test the individual LEDs prior to singulation, each of the connections would have to be laser cut. Therefore, for an array having 8×8 pads, there would be at least 64 laser cuts. This would be time-consuming and add expense. The configuration of FIG. 7 solves this problem by interconnecting the N-metal 14 in separate columns and connecting the P-metal 16 in separate rows. Since the N-metal 14 is only connected in four columns to the horizontal bus line 56, only four laser cuts need to be made at points 62 after the plating to isolate the columns. Similarly, since the P-metal 16 is only connected in four rows to a bus (not shown since external), only four laser cuts need to be made at points 64 after the plating to isolate the rows. Therefore, only eight laser cuts instead of 64 are needed. The disparity increases geometrically as the number of LED die locations increases.

After plating the submount 10 pads, the LED dies are then mounted on the submount wafer 10. During PEC etching, the bus line 56 is biased, such as by connecting it to ground, and the column busses 54 are electrically connected to the bus line 56 by the metal pattern 20 being shorted to the column busses 54 by the low resistivity PEC etch solution. This biases the N-type layers of the LEDs. The metal pattern 20 is interdigitated with the column busses 54 for increasing the width of the electrically coupling through the PEC etch solution.

After PEC etching, the individual LEDs may be separately addressable and tested on the wafer 10 by connecting a combination of the column and row busses to a drive current. The column and row interconnections of the N-metal 14 and P-metal 16 still allow addressing of each LED die individually since the columns have been isolated from each other by the four laser cuts at points 62, and the rows have been isolated from each other by the other four laser cuts at points 64.

After the PEC etch and any further wafer level processing (e.g., molding lenses, encapsulation, depositing phosphors, etc.), the submount wafer 10 is sawed or broken along the boundaries of the LED areas to singulate the LEDs. Singulating the LEDs may cut through the metal pattern 20, but the cut through has no effect on the LEDs' performance. The column busses 54 and row busses 58 are also cut through to isolate the pads of the N-metal 14 and P-metal 16.

Accordingly, the disclosed process overcomes the previously described drawbacks with direct interconnections for PEC etching (or electrochemical etching) and enables testing that could not be performed with the conventional interconnects that required the interconnects to be cut in a separate process step.

In this disclosure, the term "submount" is intended to mean a support for at least one LED die, where electrical contacts on the submount are electrically connected to electrodes on the LED dies, and where the submount has electrodes that are to be connected to receive a driving current.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating a light emitting diode (LED) structure comprising:
   providing a plurality of LEDs, each LED comprising at least a first semiconductor layer, the first semiconductor layer being exposed and connected to a first electrode of each LED;
   providing a submount wafer having a first metal portion electrically connected to the first electrode of each LED for providing an energization current to each LED, the submount wafer having a second metal portion proximate to the first metal portion but not electrically connected to the first metal portion;
   immersing at least the first semiconductor layer in a solution for electrochemical (EC) etching, the solution having a conductance that electrically connects the second metal portion to the first metal portion; and
   biasing the second metal portion with a first biasing voltage to bias the first semiconductor layer during the EC etching for etching the first semiconductor layer.

2. The method of claim 1 wherein performing EC etching comprises immersing at least the first semiconductor layer in a base solution, applying UV light to the first semiconductor layer, and biasing the base solution with a second biasing voltage to create an electric field between the base solution and the first semiconductor layer.

3. The method of claim 1 wherein the first biasing voltage is ground potential.

4. The method of claim 1 wherein the second metal portion is separated from the first metal portion by a gap between about 10 microns to 300 microns.

5. The method of claim 1 wherein the second metal portion is interdigitated with the first metal portion.

6. The method of claim 1 wherein at least some of the LEDs are connected in series, the method further comprising testing the LEDs in series by coupling a current between terminal electrodes of the LEDs in series.

7. The method of claim 1 wherein the plurality of LEDs are flip-chips.

8. The method of claim 1 further comprising performing the PEC etching by etching the first semiconductor layer to roughen a surface of the first semiconductor layer.

9. The method of claim 1 further comprising singulating the submount wafer, including electrically isolating the second metal portion, the singulating not cutting any portion of the first metal portion.

10. The method of claim 1 further comprising:
    electroplating the first metal portion prior to the step of immersing by coupling a plating biasing voltage to the first metal portion via a first interconnector; and
    disconnecting the interconnector from the first metal portion prior to the step of immersing.

11. A light emitting diode (LED) structure comprising:
    an LED comprising at least a first semiconductor layer, the first semiconductor layer connected to a first electrode of the LED; and
    a submount having a first metal portion electrically connected to the first electrode of the LED for providing an energization current to the LED, the submount having a second metal portion running along and proximate to the first metal portion but not electrically connected to the first metal portion,
    the second metal portion being electrically isolated from the LED, the second metal portion being configured for biasing the first semiconductor layer during an electrochemical (EC) etch of the first semiconductor layer, whereby a solution for the EC etch electrically connects the second metal portion to the first metal portion for coupling a bias voltage to the first metal portion.

12. The structure of claim 11 wherein the second metal portion is interdigitated with the first metal portion.

13. The structure of claim 11 wherein the second metal portion is separated from the first metal portion by a gap between about 10 microns to 300 microns.

14. The structure of claim 11 wherein the submount has been singulated from a submount wafer, wherein the singulation electrically isolated the second metal portion from other portions of the wafer.

15. The structure of claim 11 wherein the first semiconductor layer is an N-type layer that has been subjected to the EC etch.

* * * * *